United States Patent [19]

Carlson

[11] 4,161,693
[45] Jul. 17, 1979

[54] CLAMPED INPUT COMMON MODE REJECTION AMPLIFIER

[75] Inventor: Peter J. Carlson, Fort Lauderdale, Fla.

[73] Assignee: Airpax Electronics, Inc., Fort Lauderdale, Fla.

[21] Appl. No.: 775,957

[22] Filed: Mar. 9, 1977

[51] Int. Cl.² .......................... H03F 3/45; G01P 3/48
[52] U.S. Cl. ..................................... 324/173; 330/69; 330/258
[58] Field of Search .................. 330/258, 69, 252; 324/173

[56] References Cited

U.S. PATENT DOCUMENTS

| | | | |
|---|---|---|---|
| 3,497,824 | 2/1970 | Goordman | 330/258 |
| 3,562,660 | 2/1971 | Pease | 330/258 |
| 3,582,802 | 6/1971 | Weekes et al. | 330/258 |
| 3,972,020 | 7/1976 | Carroll | 330/258 |
| 4,028,686 | 6/1977 | Wilson et al. | 324/173 X |

*Primary Examiner*—James B. Mullins
*Attorney, Agent, or Firm*—LeBlanc & Shur

[57] ABSTRACT

Disclosed in a differential operational amplifier for use with a proximity type pick up. It has a common mode rejection input circuit comprising a diode and transistor connected to each input as well as diodes connected across the amplifier differential inputs. Common mode signals are clamped at the input to both protect the amplifier and prevent false transitions at the output.

16 Claims, 5 Drawing Figures

INPUT WAVEFORM
(W/ RESPECT TO ⏚)

WAVEFORM AT
LM301A INPUT
(MEASURED DIFFERENTIALLY)

CLAMPED INPUT COMMON MODE REJECTION AMPLIFIER

This invention relates to an operational amplifier circuit having high common mode rejection characteristics and more particularly to an input circuit of this type adapted for use with a magnetic pick-up and switching system.

As is well known, speed responsive devices often take the form of a magnetic pick-up positioned adjacent a gear. Rotation of the shaft upon which the gear is mounted causes the teeth to pass by the magnetic pick-up producing an electrical signal which is conventionally amplified and then used for a variety of purposes such as to operate a switch, drive a meter or the like. In order to match the magnetic pick-up head to the electrical output circuitry, the coupling is very often effected through a differential type operational amplifier. These amplifiers are constructed from solid-state devices such as transistors which are subject to overload failure or burn out in response to excessive input voltages such as 100 volts continuous input and as much as 1000 volt spikes to which they may be subjected. Furthermore, these very large common mode input excursions often cause false transitions in the output.

Various arrangements have been proposed in the past for overcoming these problems including the provision of an input transformer. However, the transformer is not usable with the so-called zero-speed switch type detectors which of necessity must have a DC frequency response. Another proposal involving the incorporation of diodes permits a DC frequency response and has been effective in protecting the operational amplifier transistors but has failed to avoid the problem of false output transitions due to high common mode input voltages and voltage spikes.

The present invention overcomes these difficulties by providing a differential type of operational amplifier having a novel arrangement of diodes and transistors connected to its input for high common mode rejection. It provides input protection for the transistors of the operational amplifier up to 100 volts continuous and 1000 volt spikes. Furthermore, no false transition of the output will be caused by these very large common mode input excursions. The amplifier need not be transformer coupled to provide these functions and the elimination of the input transformer as in previous constructions allows for DC frequency response. This provides compatibility with zero-speed gear rotation detection and also saves the substantial space and cost of a transformer.

It is therefore one object of the present invention to provide an improved common mode rejection operational amplifier.

Another object of the present invention is to provide a high common mode rejection input circuit for an amplifier.

Another object of the present invention is to provide an amplifier and associated circuitry particularly adapted for use with a zero-speed type magnetic pick-up.

Another object of the present invention is to provide a high common mode rejection input circuit for an operational amplifier which provides input protection up to 100 volts continuous and 1000 volt spikes.

Another object of the present invention is to provide an amplifier circuit in which very large common mode input excursions do not produce false transitions in the output.

Another object of the present invention is to provide a magnetic pick-up type amplifier which provides for DC frequency response and eliminates the necessity for a transformer.

These and further objects and advantages of the invention will be more apparent upon reference to the following specification, claims and appended drawing wherein:

Figure 1:
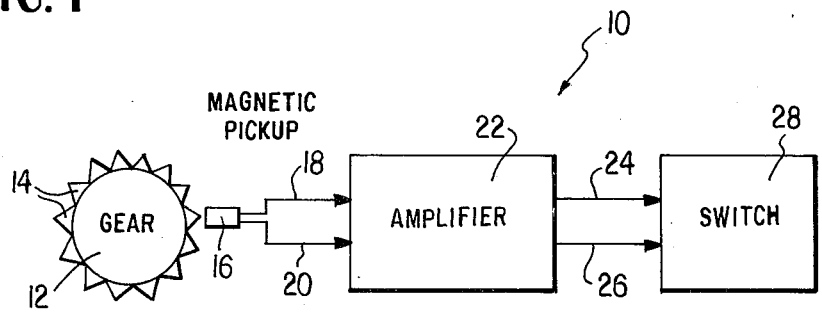
FIG. 1 is a simplified block diagram of a speed-responsive pick-up system constructed in accordance with the present invention.

FIG. 1 is a simplified diagram of a magnetic pick-up system constructed in accordance with the present invention and generally indicated at 10. It comprises a gear 12 having teeth 14 which when the gear rotates pass by in close proximity to a probe or magnetic pick-up head 16. Pick-up 16 produces an electrical output on the leads 18 and 20 which are applied to a high common mode rejection amplifier circuit 22 constructed in accordance with this invention as more fully described below. Complementary outputs from the amplifier 22 appear on leads 24 and 26 and are supplied to a suitable utilization circuit such as a switch circuit generally indicated at 28. It is a feature of this invention that the amplifier produces an output indicative not only of the rotation of the gear but also when the gear is stationary, i.e., the amplifier has a zero-frequency response. Systems of this type are used for a variety of purposes to detect the angular rotational speed of a shaft upon which the gear 12 is mounted and to actuate a switch when the shaft's speed either exceeds or falls below a predetermined value.

Figure 2:
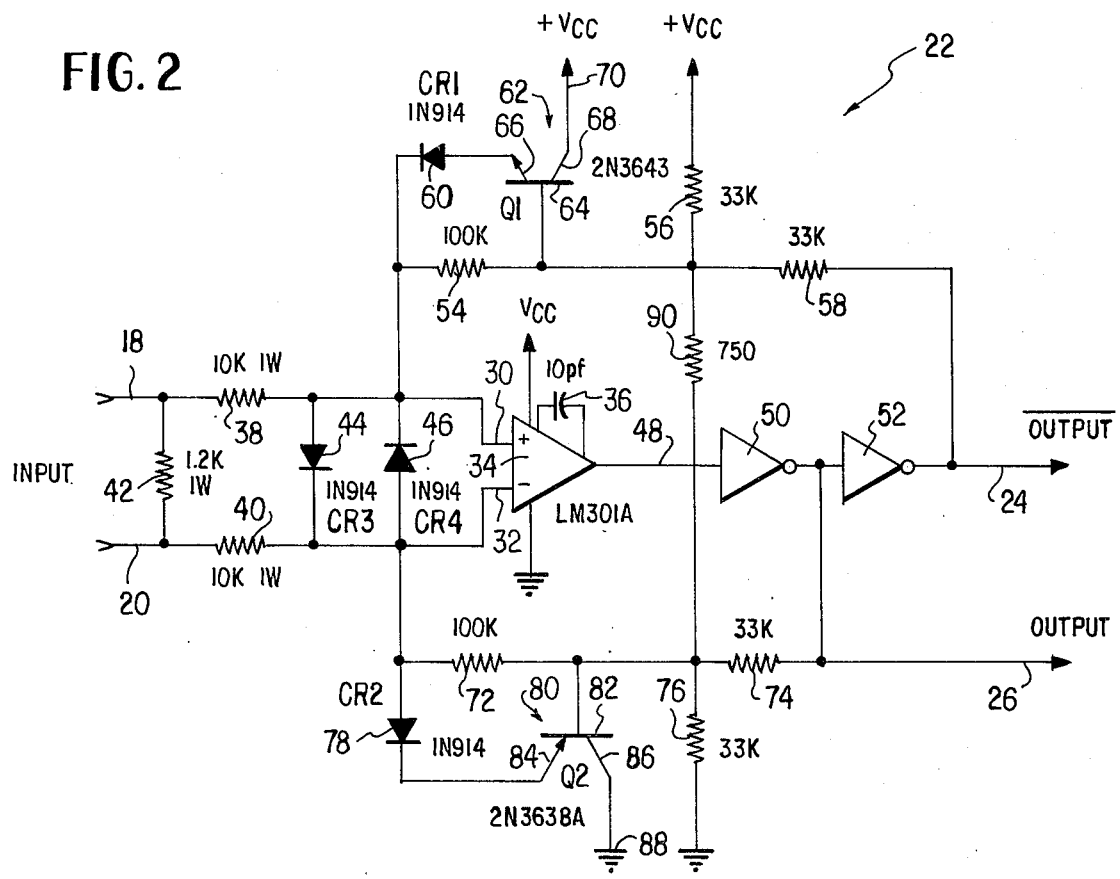
FIG. 2 is a detailed circuit diagram of the common mode rejection amplifier of FIG. 1.

Referring to FIG. 2, which is a detailed circuit diagram of the amplifier 22 of FIG. 1, the input leads 18 and 20 are connected to the positive and negative inputs 30 and 32 respectively of a differential type operational amplifier 34. This amplifier is made from an LM301A integrated circuit and is provided with an external capacitor 36.

The signal from the pick-up head or transducer 16 of FIG. 1 is through the coupling resistors 38 and 40. Connected across the inputs are resistor 42 and diodes 44 and 46. An output signal from the differential amplifier 34 is by way of a lead 48 and a pair of inverters 50 and 52, each formed by 1/6th of a 74CO4 integrated circuit to the output terminal 24. A complementary output is taken from the first inverter 50 and appears at output terminal 26.

The positive input 30 of the operational amplifier is connected to a group of resistors 54, 56 and 58 and through a diode 60 to a transistor 62 labeled Q1 comprising a base 64, an emitter 66 and a collector 68 connected to the positive side of a power supply $+V_{CC}$ as indicated at 70. Similarly the negative input 32 of the operational amplifier is connected to a group of resistors 72, 74 and 76 as well as through a diode 78 to a transistor 80 labeled Q2. Transistor 80 comprises a base 82, an emitter 84 and a collector 86, the latter connected to the other side of the power supply or ground as indicated at 88. The transistors Q1 and Q2 have their bases interconnected by a resistor 90.

The circuit in FIG. 2 functions by coupling a differential input signal to the input of the operational amplifier 34 through the two 10 K ohm resistors 38 and 40. Offset bias is provided by resistor 76 to ground in series with the 750 ohm resistor 90. Positive feedback is accomplished to provide hysteresis and is included by way of the two CMOS inverters 50 and 52 and the feedback resistors 58 and 74.

Figure 3:
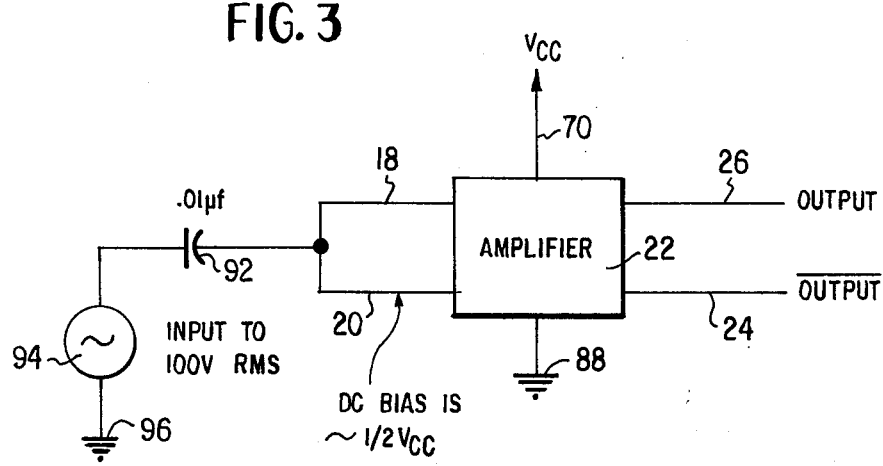
FIG. 3 is a simplified block diagram of a test arrangement for the amplifier of FIG. 2 helpful in the explanation of its operation.

The elements of the circuit which provide common mode protection are the diodes 60 and 78 and the transistors 62 and 80 (Q1 and Q2). The operation of the circuit can best be understood by reference to FIG. 3 which shows a test arrangement and the waveforms in FIGS. 4 and 5 which are plots of voltage as a function of time. FIG. 3 shows the two inputs 18 and 20 connected together and through a coupling capacitor 92 to an AC input source of up to 100 volts root mean square (RMS) as indicated at 94 with the other side grounded as at 96. A common mode signal of small amplitude and as capacitively coupled as illustrated in FIG. 3 and as would be the case with a noise signal would be seen at the input 30 and 32 of the operational amplifier as nearly undiminished. The amplifier's inherent common mode rejection is adequate to handle noise of this magnitude.

Figure 4:
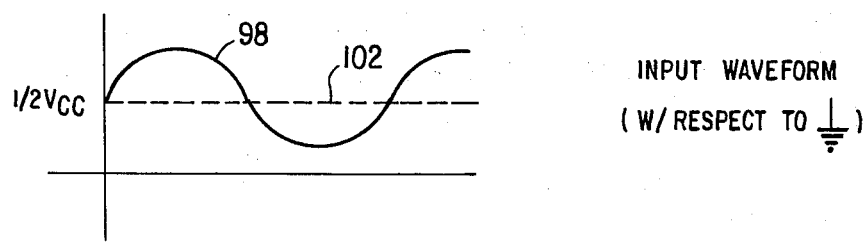
FIG. 4 is an input waveform for the test circuit of FIG. 3.
Figure 5:
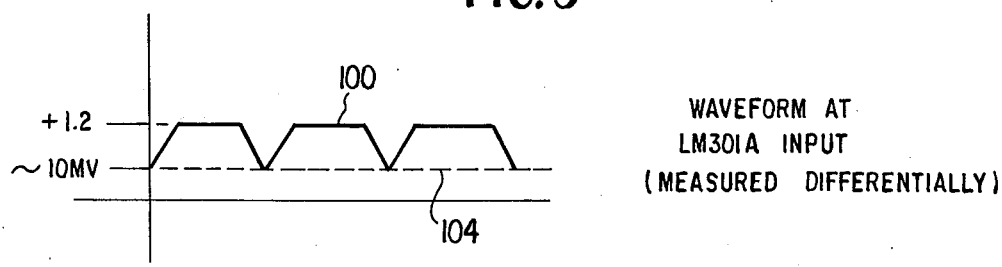
FIG. 5 is a voltage waveform at the input to the operational amplifier portion of the circuit of FIG. 2.

FIG. 4 illustrates a larger input signal with respect to ground having an average value of one-half $V_{CC}$. This is used to simulate a larger noise pulse of, by way of example only, +1.5 volts peak. Such a noise signal turns on diode 78 (CR2) and transistor 80 (Q2) clamping the positive maximum at the operational amplifier negative input terminal 32 to +1.2 volts above $\frac{1}{2} V_{CC}$. The input waveform simulating this larger noise pulse is illustrated at 98 in FIG. 4 and the clamped input at negative terminal 32 at 100 in FIG. 5. The input signal from source 94 in FIG. 4 has a peak value of approximately 1.5 volts with an average value of $\frac{1}{2} V_{CC}$ as indicated by the dashed line at 102. This signal is clipped or clamped by diode 78 and transistor 80 between +1.2 volts maximum and a minimum of approximately 10 MV as indicated by the dashed line 104 in FIG. 5.

Larger positive excursions cause diode 44 (CR3) to begin turning on and the voltage at the positive input 30 of operational amplifier 34 is clamped to +1.8 volts. The differential input is in this way caused to be 0.6 volts and the amplifier common mode range is not exceeded and therefore, the amplifier output is positive. This is important since exceeding the common mode range of the amplifier can cause spurious output transitions.

A negative common mode noise pulse causes diode 60 (CR1) and transistor 62 (Q1) to turn on. Diode 44 (CR3) is again caused to turn on and again the amplifier input goes positive. Both positive and negative common mode transistions cause an increasing positive bias at the amplifier input and limit excursions to magnitudes safe for the LM301A inputs at 30 and 32.

To summarize, the present invention provides a novel operational amplifier configuration which not only protects the integrated circuit transistors at the amplifier inputs from excessive voltages but at the same time clamps the input so that noise impulses or excessive voltages at the input do not exceed the common mode range rejection capabilities of the amplifier itself. In this way, not only is the amplifier protected but false transitions of the output which would otherwise be an erroneous indication of a normal mode pick-up signal are avoided.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced herein.

What is claimed and desired to be secured by United States Letters Patent is:

1. An operational amplifier having postive and negative differential inputs and an output, a positive power supply terminal, first solid state clamping means coupling said positive input to said positive power supply terminal, a negative power supply terminal, and second solid state clamping means coupling said negative input to said negative power supply terminal whereby excessive common mode voltage input excursions are clamped to avoid false switching of said output, wherein said clamping devices each includes a transistor and a diode.

2. A rotational speed sensing system comprising a gear with teeth, a pickup adjacent said gear and sensitive to the proximity of said gear teeth for producing a differential electrical output indicative of the rotational speed of said gear, an operational amplifier having positive and negative differential inputs coupled to said pickup, a positive power supply terminal, first solid state clamping means coupling said positive amplifier input to said positive power supply terminal, a negative power supply terminal, second solid state clamping means coupling said negative amplifier input to said negative power supply terminal, and an output terminal coupled to the output of said operational amplifier.

3. A speed sensing system according to claim 2 including a switching circuit coupled to said output terminal.

4. A speed sensing system according to claim 3 including a pair of output terminals having complementary outputs coupling said operational amplifier to said switching circuit.

5. A speed sensing system according to claim 2 including a protective diode coupled across the positive and negative differential inputs of said amplifier.

6. A speed sensing system according to claim 5 including a pair of protective diodes coupled in opposite directions across the positive and negative inputs of said amplifier.

7. A speed sensing system according to claim 6 wherein said pickup comprises a magnetic probe located adjacent the path of movement of said gear teeth.

8. A speed sensing system according to claim 7 wherein each of said solid state clamping means comprises a transistor having an emitter, base and collector and a diode in series with the emitter-collector circuit of each respective transistor.

9. A speed sensing system according to claim 8 wherein said transistor coupled to said positive power supply is an NPN junction transistor and wherein said transistor coupled to said negative power supply is a PNP junction transistor.

10. A speed sensing system according to claim 6 wherein said amplifier is coupled to said probe solely by resistors.

11. A speed sensing system according to claim 10 including a first coupling resistor directly connecting one output of said probe to one input of said amplifier and directly connecting the other output of said probe to the other output of said amplifier.

12. An operational amplifier having positive and negative differential inputs and an output, a positive power supply terminal, first solid state clamping means, including a transistor and a diode, coupling said positive input to said positive power supply terminal, second solid state clamping means, including a transistor and a diode, coupling said negative input to said negative power supply terminal, and an additional diode coupled across said positive and negative differential inputs, whereby excessive common mode voltage input excursions are clamped to avoid false switching of said output.

13. An amplifier according to claim 12 including feedback means coupled between said amplifier output and each of said differential inputs.

14. An amplifier according to claim 13 wherein said feedback means comprises a pair of inverters.

15. An amplifier according to claim 14 wherein said inverters are connected in series to said amplifier output, a first resistor coupling the output of one of said inverters to said negative differential input and a second resistor coupling the output of the other of said inverters to said positive differential input.

16. An amplifier according to claim 15 including an output terminal coupled to the output of said inverters.

* * * * *